United States Patent
Nam et al.

(10) Patent No.: US 11,004,988 B2
(45) Date of Patent: May 11, 2021

(54) SOLAR CELL AND METHOD FOR MANUFACTURING THE SAME

(71) Applicant: LG Electronics Inc., Seoul (KR)

(72) Inventors: Jeongbeom Nam, Seoul (KR); Mihee Heo, Seoul (KR); Eunjoo Lee, Seoul (KR); Ilhyoung Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 327 days.

(21) Appl. No.: 14/221,111

(22) Filed: Mar. 20, 2014

(65) Prior Publication Data

US 2014/0338738 A1 Nov. 20, 2014

(30) Foreign Application Priority Data

May 20, 2013 (KR) .................. 10-2013-0056314

(51) Int. Cl.
*H01L 31/0224* (2006.01)
*H01L 31/18* (2006.01)
*H01L 31/068* (2012.01)

(52) U.S. Cl.
CPC .. *H01L 31/022425* (2013.01); *H01L 31/0684* (2013.01); *H01L 31/18* (2013.01); *Y02E 10/547* (2013.01)

(58) Field of Classification Search
CPC ......... H01L 31/022425; H01L 31/0684; H01L 31/18; Y02E 10/547
USPC ................................. 136/242–265
See application file for complete search history.

(56) References Cited

U.S. PATENT DOCUMENTS

| | | | |
|---|---|---|---|
| 2010/0037941 A1* | 2/2010 | Borland | H01B 1/04 136/255 |
| 2010/0154875 A1 | 6/2010 | Borland et al. | |
| 2011/0287568 A1* | 11/2011 | Suzuki | H01L 31/02008 438/57 |
| 2012/0142140 A1* | 6/2012 | Li | H01L 31/0682 438/98 |
| 2013/0061916 A1* | 3/2013 | Baker-O'Neal | H01L 31/022425 136/256 |
| 2013/0122645 A1* | 5/2013 | Sakamoto | H01L 21/6715 438/98 |
| 2013/0183796 A1* | 7/2013 | Stewart | H01L 31/068 438/98 |

(Continued)

FOREIGN PATENT DOCUMENTS

| | | |
|---|---|---|
| CN | 102301485 A | 12/2011 |
| CN | 103098227 A | 5/2013 |
| EP | 2592658 A1 | 5/2013 |

(Continued)

*Primary Examiner* — Magali P Slawski
*Assistant Examiner* — Kourtney R S Carlson
(74) *Attorney, Agent, or Firm* — Dentons US LLP (57) ABSTRACT

A solar cell includes a substrate of a first conductive type, a first doped region positioned at a first surface of the substrate and contains impurities of a second conductive type different from the first conductive type, and a first electrode part electrically connected to the first doped region. The first electrode part includes a thermosetting resin, and first and second conductive particles distributed in the thermosetting resin. The second conductive particles have a work function greater than the first conductive particles and form silicide at an interface contacting the first doped region.

7 Claims, 4 Drawing Sheets

(56) References Cited

U.S. PATENT DOCUMENTS

2014/0021472 A1\* 1/2014 Hahn .................. C09D 11/033
257/53

FOREIGN PATENT DOCUMENTS

| | | | |
|---|---|---|---|
| JP | 5896777 | A | 6/1983 |
| JP | 715022 | A | 1/1995 |
| JP | 2001237448 | A | 8/2001 |
| JP | 2008135654 | A | 6/2008 |
| JP | 2008-192921 | A | 8/2008 |
| JP | 2011181680 | A | 9/2011 |
| JP | 2012043789 | A | 3/2012 |
| JP | 2013539230 | A | 10/2013 |
| JP | 2014522545 | A | 9/2014 |
| KR | 10-2010-00031727 | A | 3/2010 |
| KR | 10-2012-00079591 | A | 7/2012 |
| WO | 2010019532 | A2 | 2/2010 |
| WO | WO-2012136387 | A2 \* | 10/2012 ..... H01L 31/022425 |

\* cited by examiner

| Metal | Work function (eV) | Schottky barrier (Φb) |
|---|---|---|
| Aluminum(Al) | 4.28 | 0.87 |
| Silver(Ag) | 4.26 | 0.89 |
| Nickel(Ni) | 5.10 | 0.05 |
| Nickel silicide (NiSi) | 4.82 | 0.33 |

SOLAR CELL AND METHOD FOR MANUFACTURING THE SAME

This application claims priority to and the benefit of Korean Patent Application No. 10-2013-0056314 filed in the Korean Intellectual Property Office on May 20, 2013, the entire contents of which are incorporated herein by reference.

BACKGROUND

Field of the Disclosure

Embodiments of the invention relate to a solar cell and a method for manufacturing the same.

Background

Solar power generation to convert light energy into electric energy using a photoelectric conversion effect has been widely used as a method for obtaining eco-friendly energy. A solar power generation system using a plurality of solar cell modules has been installed in places, such as houses, due to an improvement in a photoelectric conversion efficiency of solar cells.

The solar cell generally includes a substrate and an emitter region forming a p-n junction along with the substrate and generates electric current using light incident on a surface of the substrate.

SUMMARY

In one aspect, there is a solar cell including a substrate of a first conductive type, a first doped region which is positioned at a first surface of the substrate and contains impurities of a second conductive type opposite the first conductive type, and a first electrode part electrically connected to the first doped region, wherein the first electrode part includes a thermosetting resin, and first and second conductive particles distributed in the thermosetting resin, and the second conductive particles have a work function greater than the first conductive particles and form silicide at an interface contacting the first doped region.

For example, the first conductive particles may be formed of silver (Ag) particles, and the second conductive particles may be formed of nickel (Ni) particles. In this instance, silicide formed at an interface contacting a $p^+$-type doped region may be nickel silicide.

The thermosetting resin of the first electrode part may include a monomer-based epoxy resin or an acrylic resin.

The first doped region may be formed as an emitter region. A dielectric layer may be formed on the emitter region, on which the first electrode part is not positioned.

The first electrode part may include a plurality of first finger electrodes extending in a first direction and a plurality of first bus bar electrodes extending in a second direction crossing the first finger electrodes.

In another aspect, there is a method for manufacturing a solar cell including forming a first doped region containing impurities of a second conductive type opposite a first conductive type at a first surface of a substrate of the first conductive type, forming a dielectric layer having an opening exposing a portion of the first doped region on the first doped region, printing an electrode paste including a thermosetting resin, first conductive particles distributed in the thermosetting resin, and second conductive particles, which are distributed in the thermosetting resin, have a work function greater than the first conductive particles, performing a thermal process on the electrode paste at a low temperature to cure the electrode paste, and forming silicide at an interface at which the second conductive particles and the first doped region contact each other.

The first conductive particles may be silver (Ag), and the second conductive particles may be nickel (Ni).

Nickel silicide may be formed at the interface, at which the second conductive particles and the first doped region contact each other, using the second conductive particles formed of nickel.

The first doped region may be formed as an emitter region.

In a general solar cell, an electrode part is formed by printing, drying, and curing a silver (Ag) paste containing aluminum (Al), and conductive particles (for example, Ag particles and Al particles) of the electrode part bring into contact with a doped region of a conductive type opposite a conductive type of a substrate due to an etching operation of a glass frit generated when the Ag paste is cured.

As described above, when the electrode part is formed using the Ag paste containing aluminum (Al), a thermal process has to be performed on the Ag paste at a high temperature of about 800° C. to 900° C.

Accordingly, a defect inside a silicon bulk forming the substrate increases, and life time of the silicon bulk decreases. Further, an open-circuit voltage and a short circuit current density are reduced.

To solve the above-described problems, a method for forming the electrode part using a silver paste for low temperature curing using a resin as a binder was recently developed.

However, when the Ag paste for low temperature curing is used to form the electrode part, Schottky barrier resulting from a work function of silver increases. Hence, a contact resistance increases, and a fill factor of the solar cell increases.

On the other hand, the electrode part according to the embodiment of the invention includes the first conductive particles (for example, silver (Ag) particles) and the second conductive particles (for example, nickel (Ni) particles) having the work function greater than the first conductive particles, and thus Schottky barrier of the electrode part is reduced. Hence, the contact resistance of the electrode part is reduced.

Further, because silicide is formed at the interface, at which the second conductive particles and the doped region contact each other, the contact resistance of the electrode part is further reduced.

BRIEF DESCRIPTION OF THE DRAWINGS

The accompanying drawings, which are included to provide a further understanding of the disclosure and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc., may be used to describe various components, but the components are not limited by such terms. The terms are used only for the purpose of distinguishing one component from other components.

For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component (s) may exist between them, although the arbitrary component may be directly connected to, or linked to, the second component.

On the other hand, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and do not preclude the existence of one or more different features, numbers, steps, operations, components, parts or combinations thereof, or the possibility of the addition thereof.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless otherwise specified, all of the terms which are used herein, including the technical or scientific terms, may have the same meanings as those that are generally understood by a person having ordinary knowledge in the art.

The terms defined in a generally used dictionary is understood to have meanings as those used in the context of a related art, and should not be construed to have ideal or excessively formal meanings unless they are obviously specified in the present application.

The following exemplary embodiments of the invention are provided to those skilled in the art in order to provide the present disclosure more completely. Accordingly, shapes and sizes of elements shown in the drawings may be exaggerated for clarity.

Exemplary embodiments of the invention will be described with reference to FIGS. 1 to 5.

Figure 1:
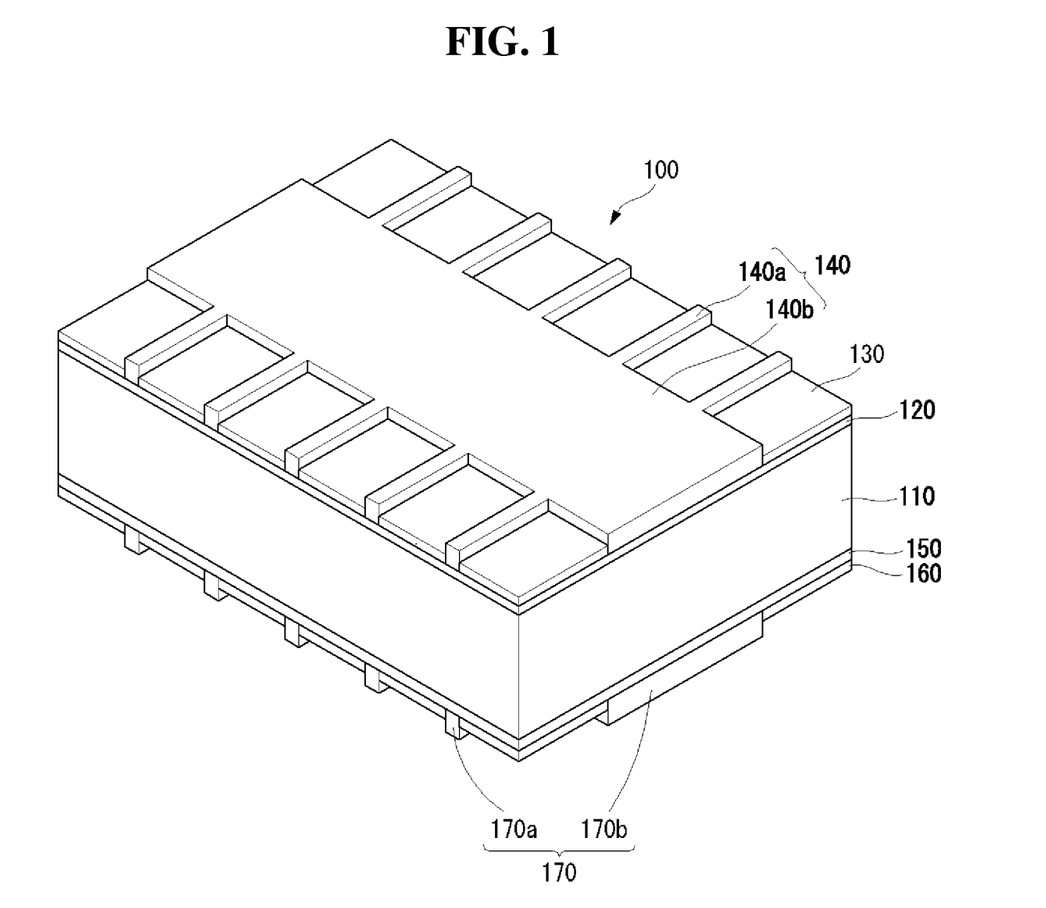
FIG. 1 is a perspective view of a main part of a solar cell according to an exemplary embodiment of the invention.

FIG. 1 is a perspective view of a main part of a solar cell according to an exemplary embodiment of the invention. More specifically, FIG. 1 is a perspective view of a main part of a bifacial solar cell. However, the embodiment of the invention is not limited to the bifacial solar cell and may be applied to solar cells of various structures.

A bifacial solar cell module including a plurality of bifacial solar cells 100 includes an interconnector for electrically connecting the adjacent bifacial solar cells 100, protective layers for protecting the bifacial solar cells 100, a light transmission front substrate positioned on the protective layer at front surfaces of the bifacial solar cells 100, and a light transmission back substrate positioned on a back surface of the protective layer at back surfaces of the bifacial solar cells 100.

The light transmission front substrate and the light transmission back substrate prevent moisture or oxygen from penetrating the outside of the bifacial solar cell module, thereby protecting the bifacial solar cells 100 from an external environment.

The light transmission front substrate and the light transmission back substrate are formed of a tempered glass having a high transmittance and an excellent damage prevention function. The tempered glass may be a low iron tempered glass containing a small amount of iron.

The light transmission front substrate and the light transmission back substrate may have an embossed inner surface so as to increase a scattering effect of light.

The light transmission front substrate and the light transmission back substrate may be formed of the low iron tempered glass or a polymer resin. In the embodiment disclosed herein, polyethylene terephthalate (PET) may be used as the polymer resin.

A lamination process is performed on the protective layers in a state where the protective layers are respectively positioned on the front surfaces and the back surfaces of the bifacial solar cells 100 to form an integral body of the protective layers and the bifacial solar cells 100. Hence, the protective layers prevent corrosion of the bifacial solar cells 100 resulting from the moisture penetration and protect the bifacial solar cells 100 from an impact.

The protective layers may be formed of ethylene vinyl acetate (EVA) or silicon resin. However, other materials may be used.

Referring to FIG. 1, the bifacial solar cell 100 according to the embodiment of the invention may include a substrate 110 of a first conductive type, a first doped region 120 which is positioned at a first surface (for example, a front surface) of the substrate 110 and contains impurities of a second conductive type opposite the first conductive type, a first electrode part 140 which is positioned on the first doped region 120 and is electrically and/or physically connected to the first doped region 120, a second doped region 150 which is positioned at a second surface (for example, a back surface) opposite the first surface of the substrate 110 and contains impurities of the first conductive type at a concentration higher than the substrate 110, and a second electrode part 170 which is positioned on a back surface of the second doped region 150 and is electrically and/or physically connected to the second doped region 150.

The substrate 110 may be formed of a silicon wafer of the first conductive type, for example, an n-type. Silicon used in the silicon wafer may be single crystal silicon, polycrystalline silicon, or amorphous silicon.

When the substrate 110 is of the n-type, the substrate 110 contains impurities of a group V element such as phosphorus (P), arsenic (As), and antimony (Sb).

Alternatively, the substrate 110 may be formed of a silicon wafer of a p-type. In this instance, the substrate 110 may contain impurities of a group III element such as boron (B), gallium (Ga), and indium (In).

As described above, the substrate 110 may be of the n-type or the p-type. In the following description, the embodiment of the invention is described using an n-type substrate as an example of the substrate 110.

The first doped region 120 positioned at the front surface of the substrate 110 is an impurity region containing impurities of the p-type opposite the conductive type (for example, the n-type) of the substrate 110 and forms a p-n junction along with the substrate 110. Thus, in the embodiment of the invention, the first doped region 120 forms an emitter region.

When the substrate 110 is the n-type substrate, the first doped region 120 may be formed by doping p-type impurities, for example, impurities of a group III element such as boron (B), gallium (Ga), and indium (In) on the first surface of the substrate 110 at a uniform concentration. Thus, in the embodiment of the invention, an impurity doping concentration of the first doped region 120 is uniform.

On the contrary, when the substrate 110 is the p-type substrate, the first doped region 120 may be formed by doping n-type impurities on the first surface of the substrate 110 at a uniform concentration.

Alternatively, the first doped region 120 may be configured as a selective emitter region having different impurity doping concentrations depending on its position.

In this instance, an impurity doping concentration of the first doped region 120, on which the first electrode part 140 positioned on the first surface of the substrate 110 is formed, may be different from an impurity doping concentration of the first doped region 120, on which the first electrode part 140 is not formed. For example, the impurity doping concentration of the first doped region 120, on which the first electrode part 140 is formed, may be higher or lower than the impurity doping concentration of the first doped region 120, on which the first electrode part 140 is not formed.

Carriers, i.e., electron-hole pairs produced by light incident on the substrate 110 are separated into electrons and holes by a built-in potential difference resulting from the p-n junction between the substrate 110 and the first doped region 120. Then, the separated electrons move to the n-type semiconductor, and the separated holes move to the p-type semiconductor.

Thus, the separated electrons move to the n-type substrate 110, and the separated holes move to the first doped region 120. Hence, the electrons become major carriers in the n-type substrate 110, and the holes become major carriers in the first doped region 120.

A front dielectric layer 130 may be formed on the first doped region 120. The front dielectric layer 130 may be formed of metal oxide-based material, for example, at least one of silicon nitride (SiNx), silicon oxide (SiOx), aluminum oxide (AlOx), and titanium dioxide ($TiO_2$). The front dielectric layer 130 may serve as an anti-reflection layer, which reduces a reflectance of light incident on the bifacial solar cell 100 through the first surface of the substrate 110 and increases selectivity of light of a predetermined wavelength band. In addition, the front dielectric layer 130 may serve as a passivation layer. Alternatively, the front dielectric layer 130 may not be formed on the first surface of the substrate 110.

When the front dielectric layer 130 is formed on the first surface of the substrate 110, the front dielectric layer 130 may include an opening exposing a portion of the first doped region 120. The first electrode part 140 is formed on the first doped region 120 exposed by the opening of the front dielectric layer 130.

The first electrode part 140 may include a plurality of finger electrodes 140a extending in a first direction X-X' and a plurality of bus bar electrodes 140b extending in a second direction Y-Y' orthogonal to the first direction X-X'.

Figure 2:
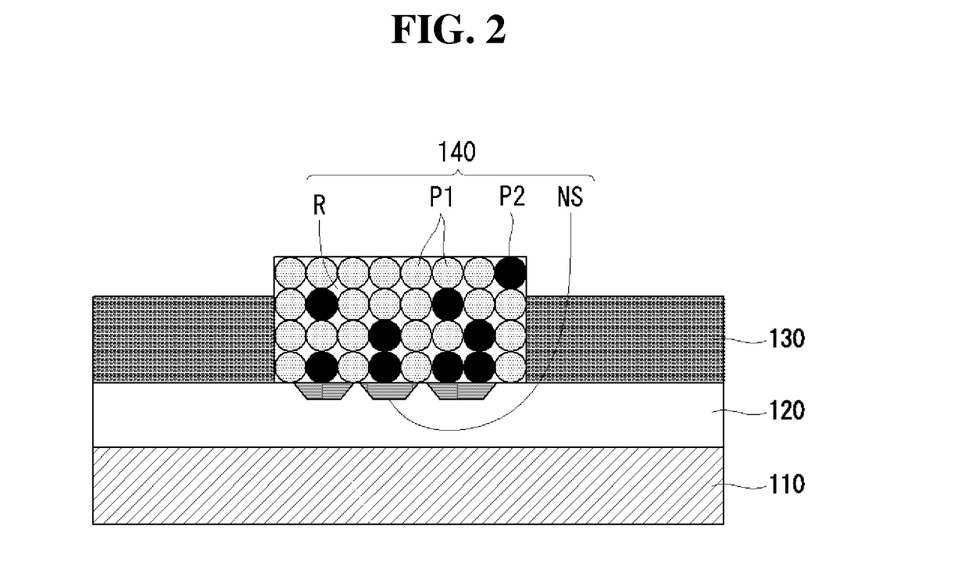
FIG. 2 is a cross-sectional view of a main part of the solar cell shown in FIG. 1.

The first electrode part 140 of the above-described configuration includes first conductive particles P1 for securing the electrical conductivity and second conductive particles P2 having a work function greater than the first conductive particles P1.

The first conductive particles P1 may be formed of metal, for example, silver (Ag) having excellent electrical conductivity, and the second conductive particles P2 may be formed of metal, for example, nickel (Ni) capable of forming silicide NS at an interface contacting the first doped region 120.

When the second conductive particles P2 are formed of nickel (Ni), nickel silicide (NiSi) is formed at the interface between the second conductive particles P2 and the first doped region 120. The first electrode part 140 further includes a resin R for securing an adhesive strength of the first and second conductive particles P1 and P2 with respect to the substrate 110.

The resin R of the first electrode part 140 may be formed of a thermosetting resin including a monomer-based epoxy resin, an acrylic resin, etc.

The first electrode part 140 of the above-described configuration is formed by printing, drying, and curing an electrode paste including the resin R and the first and second conductive particles P1 and P2 distributed in the resin R and then performing the silicidation of the electrode paste.

As described above, the first electrode part 140 includes the first conductive particles P1 formed of silver (Ag) and the second conductive particles P2 formed of nickel (Ni), and nickel silicide (NiSi) is formed at the interface between the second conductive particles P2 and the first doped region 120.

Figure 3:
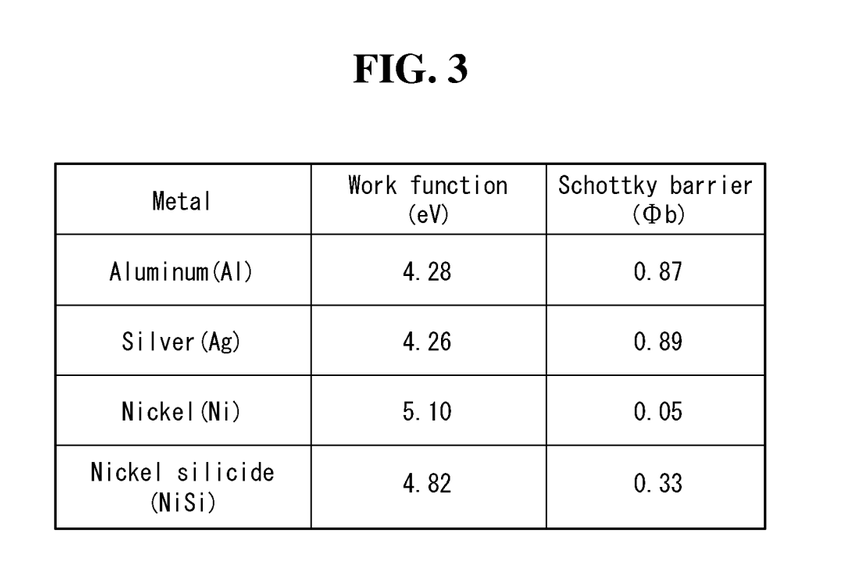
FIG. 3 is a table indicating a work function and schottky barrier of each of various kinds of metals.

However, as shown in FIG. 3, nickel (Ni) forming the second conductive particles P2 has a work function greater than silver (Ag) forming the first conductive particles P1.

More specifically, as shown in FIG. 3, silver (Ag) has a work function of about 4.26 eV, and nickel (Ni) has a work function of about 5.10 eV which is greater than silver (Ag). Further, when the n-type substrate 110 is formed of polycrystalline silicon, Schottky barrier of silver (Ag) is about 0.89, and Schottky barrier of nickel (Ni) is about 0.05 which is much less than silver (Ag).

Accordingly, a contact resistance between the first doped region 120 and the first electrode part 140 including the first conductive particles P1 and the second conductive particles P2 having the work function greater than the first conductive particles P1, is less than a contact resistance between the first doped region 120 and the first electrode part including only the first conductive particles P1.

Further, nickel silicide (NiSi) formed at the interface between the second conductive particles P2 and the first doped region 120 has a work function of about 4.82 eV and Schottky barrier of about 0.33. Therefore, nickel silicide (NiSi) has the work function less than nickel (Ni) and the Schottky barrier greater than nickel (Ni). However, nickel silicide (NiSi) has a specific resistance less than nickel (Ni).

Accordingly, the contact resistance between the first doped region 120 and the first electrode part 140 is further reduced by nickel silicide (NiSi) formed at the interface between the second conductive particles P2 and the first doped region 120.

Figure 4:
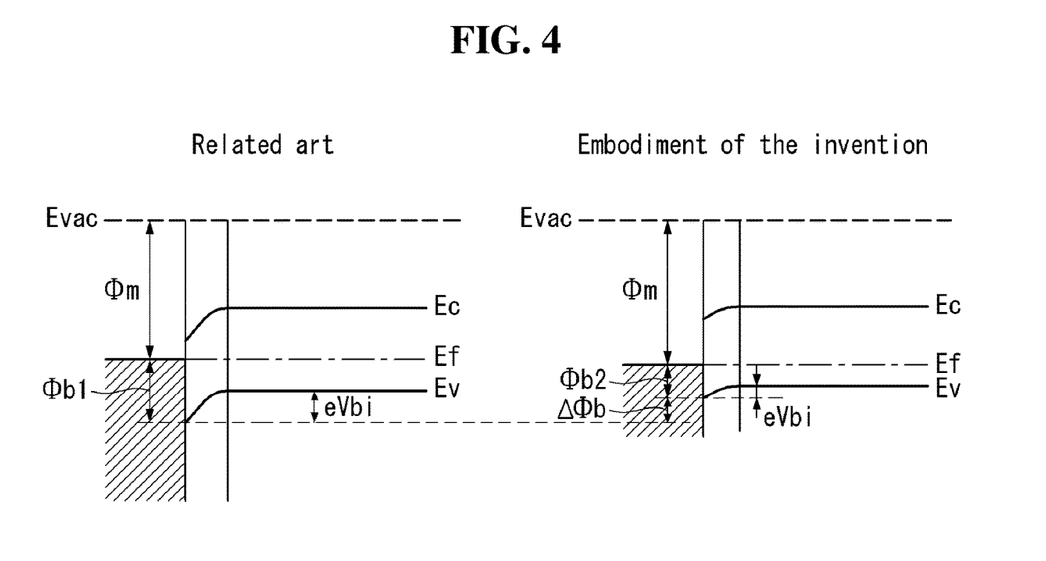
FIG. 4 illustrates a difference between schottky barrier of a related art solar cell and schottky barrier of a solar cell according to an exemplary embodiment of the invention.

As shown in FIG. 4, Schottky barrier of a related art first electrode part including only first conductive particles has a first height $\Phi b1$. On the other hand, Schottky barrier of the first electrode part 140 according to the embodiment of the invention including the first conductive particles P1, the second conductive particles P2, and nickel silicide (NiSi) has a second height $\Phi b2$ which is less than the first height $\Phi b1$ by a predetermined height $\Delta\Phi b$.

In the embodiment of the invention, when the first conductive particles P1 are formed of silver (Ag) and the second conductive particles P2 are formed of nickel (Ni), it is preferable that the first electrode part 140 includes about 15 wt % to 25 wt % of the nickel particles P2 based on the total weight of the silver particles P1 and the nickel particles P2.

Because a specific resistance of the nickel particles P2 is about five times greater than a specific resistance of the silver particles P1, the electrical characteristics of the solar cell when only the nickel particles P2 are used as the conductive particles distributed in the thermosetting resin R of the first electrode part 140, are reduced because of a very large line resistance of the first electrode part 140.

Alternatively, even when both the silver particles P1 and the nickel particles P2 are used as the conductive particles distributed in the thermosetting resin R, the line resistance of the first electrode part 140 increases as an amount of nickel particles P2 increases.

Accordingly, it is preferable that an amount of nickel particles P2 based on the total weight of the silver particles P1 and the nickel particles P2 is set in consideration of the line resistance of the first electrode part 140 and the contact resistance between the first doped region 120 and the first electrode part 140.

According to an experiment conducted by the present inventors, when the amount of nickel particles P2 was equal to or greater than about 25 wt % based on the total weight of the silver particles P1 and the nickel particles P2, the electrical characteristics of the solar cell were no longer improved even if the amount of nickel particles P2 further increased.

When the amount of nickel particles P2 was less than about 15 wt % based on the total weight of the silver particles P1 and the nickel particles P2, it was difficult to efficiently reduce the height of the Schottky barrier of the first electrode part 140. Further, because a small amount of nickel silicide (NiSi) was produced, an improvement effect of the contact resistance between the first doped region 120 and the first electrode part 140 was small.

Accordingly, it is preferable that the amount of nickel particles P2 is about 15 wt % to 25 wt % based on the total weight of the silver particles P1 and the nickel particles P2.

When the size of the nickel particles P2 is very small (for example, when the size of the nickel particles P2 is expressed in the unit of nano), an additive, such as a distribution stabilizer, has to be used because it is difficult to efficiently distribute the nickel particles P2 in the resin R. However, the additive increases the line resistance of the first electrode part 140.

In the embodiment disclosed herein, the size of the nickel particles P2 may refer to a diameter.

Accordingly, even if the additive, such as the distribution stabilizer, is not used in the embodiment of the invention, the nickel particles P2 may be efficiently distributed in the resin R by using the nickel particles P2 having the size expressed in the unit of micro.

For example, it is preferable that the size of the nickel particles P2 is about 2 μm to 10 μm.

The first electrode part 140 of the above-described configuration collects carriers (for example, holes) moving to the first doped region 120.

The second electrode part 170 positioned on the back surface of the substrate 110 collects carriers (for example, electrons) moving to the substrate 110 and outputs the carriers to an external device.

In the embodiment of the invention, the second electrode part 170 includes a plurality of finger electrodes 170a formed at a location corresponding to the finger electrodes 140a of the first electrode part 140 and a plurality of bus bar electrodes 170b formed at a location corresponding to the bus bar electrodes 140b of the first electrode part 140.

It is preferable that the number of finger electrodes 170a of the second electrode part 170 is more than the number of finger electrodes 140a of the first electrode part 140.

The second electrode part 170 may be formed using the same electrode paste as the first electrode part 140. In this instance, the second electrode part 170 may be formed by printing, drying, and curing the electrode paste including the resin R and the first and second conductive particles P1 and P2 distributed in the resin R.

The second doped region 150 electrically and/or physically connected to the second electrode part 170 is positioned at the entire back surface of the substrate 110 and forms a potential barrier by a difference between impurity doping concentrations of the substrate 110 and the second doped region 150. Hence, the second doped region 150 serves as a back surface field region which prevents or reduces holes from moving to the back surface of the substrate 110. As a result, a recombination and/or a disappearance of electrons and holes at and around the surface of the substrate 110 are reduced.

Alternatively, the second doped region 150 may be locally positioned at the back surface of the substrate 110, on which the second electrode part 170 is positioned, and may have a selective structure having different impurity doping concentrations in the same manner as the selective emitter region.

In the back surface field region having the selective structure, an impurity doping concentration of the second doped region 150, on which the second electrode part 170 is positioned, may be higher or lower than an impurity doping concentration of the second doped region 150, on which the second electrode part 170 is not positioned.

When the second electrode part 170 is formed using the electrode paste having the same configuration as the electrode paste forming the first electrode part 140, silicide is formed at an interface between the second conductive particles P2 and the second doped region 150 in the same or similar manner as the first electrode part 140.

In this instance, the first doped region 120 shown in FIG. 2 may be the second doped region 150, and the front dielectric layer 130 may be a back dielectric layer 160 positioned on the back surface of the second doped region 150, on which the second electrode part 170 is not positioned.

The back dielectric layer 160 may be formed of at least one of silicon nitride (SiNx), silicon oxide (SiOx), aluminum oxide (AlOx), and titanium dioxide ($TiO_2$) in the same manner as the front dielectric layer 130. The back dielectric layer 160 may be omitted if necessary or desired, in the same manner as the front dielectric layer 130.

When light irradiated onto the bifacial solar cell 100 having the above-described configuration is incident on the substrate 110 through the first doped region 120 and the second doped region 150, a plurality of electron-hole pairs are generated in the substrate 110 by light energy produced by the light incident on the substrate 110.

When the front dielectric layer 130 is positioned on the front surface of the substrate 110 and the back dielectric layer 160 is positioned on the back surface of the substrate 110, the front dielectric layer 130 and the back dielectric layer 160 reduce a reflection loss of light incident on the substrate 110. Hence, an amount of light incident on the substrate 110 further increases.

The electron-hole pairs are separated into electrons and holes by the p-n junction between the substrate 110 and the first doped region 120. Then, the separated electrons move to the n-type substrate 110, and the separated holes move to the p-type first doped region 120.

As described above, the electrons moving to the substrate 110 move to the second electrode part 170 through the second doped region 150, and the holes moving to the first doped region 120 move to the first electrode part 140.

Accordingly, when the first electrode part 140 of one solar cell is connected to the second electrode part 170 of another solar cell adjacent to the one solar cell using electric wires, for example, the interconnector, electric current flows through the solar cells and allows use of the electric current for electric power.

Figure 5:
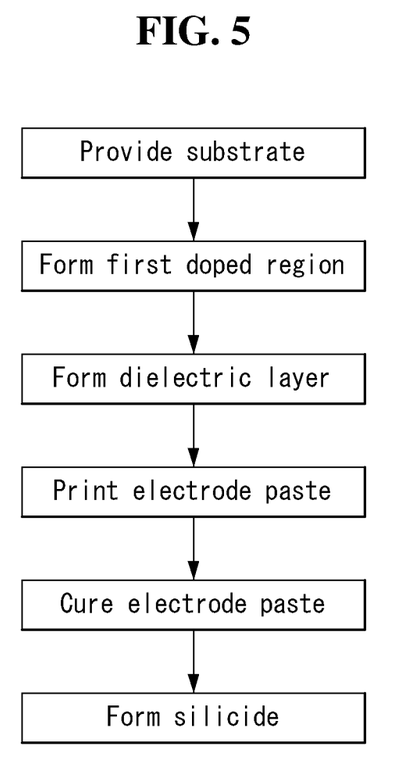
FIG. 5 is a block diagram illustrating a method for manufacturing the solar cell shown in FIG. 1.

A method for manufacturing the solar cell is described below. FIG. 5 is a block diagram illustrating a method for manufacturing the solar cell shown in FIG. 1.

First, the first doped region 120 containing impurities of the second conductive type opposite the first conductive type is formed at the first surface of the substrate (for example, the n-type substrate 110) of the first conductive type.

Before forming the first doped region 120, the first surface of the substrate 110 may be textured to form a textured surface corresponding to an uneven surface having a plurality of uneven portions or having uneven characteristics.

Next, the front dielectric layer 130 is formed on the first doped region 120. The front dielectric layer 130 may be formed using a chemical vapor deposition (CVD) method such as a plasma enhanced chemical vapor deposition (PECVD) method. The front dielectric layer 130 may have a single-layered structure or a multi-layered structure.

After the front dielectric layer 130 is formed, the front dielectric layer 130 is partially etched to expose a portion of the first doped region 120, in which the first electrode part 140 is formed. When the front dielectric layer 130 is partially etched, the front dielectric layer 130 includes an opening exposing the portion of the first doped region 120. The opening may be formed in the same pattern (for example, a grid pattern) as the first electrode part 140.

A laser may be used to form the opening in the front dielectric layer 130, but the embodiment of the invention is not limited thereto. A photolithography process may be used.

Next, an electrode paste for low temperature curing is printed and dried on the first doped region 120 exposed by the opening of the front dielectric layer 130.

The embodiment of the invention is described as having the electrode paste printed and dried after forming the front dielectric layer 130. However, the electrode paste may be printed and dried in a state where the front dielectric layer 130 is not formed on the first doped region 120.

The electrode paste for low temperature curing includes a thermosetting resin R, first conductive particles P1 distributed in the thermosetting resin R, and second conductive particles P2 which are distributed in the thermosetting resin R and having a work function greater than the first conductive particles P1, and forming silicide at an interface contacting the first doped region 120.

In the embodiment disclosed herein, the thermosetting resin R may include one of a monomer-based epoxy resin and an acrylic resin which are thermally processed and cured at a low temperature (for example, about 230° C. to 260° C.). The first conductive particles P1 may be silver (Ag) particles, and the second conductive particles P2 may be nickel (Ni) particles.

After the electrode paste for low temperature curing is dried, a thermal process is performed on the electrode paste for low temperature curing at a low temperature of about 240° C. to cure the electrode paste.

A thermal process, which is performed at a temperature (for example, about 800° C. to 900° C.) higher than the electrode paste for low temperature curing according to the embodiment of the invention, has to be used to cure a related art electrode paste including a glass frit and first conductive particles (for example, Ag particles) distributed in the glass frit.

On the other hand, the electrode paste for low temperature curing according to the embodiment of the invention does not include the glass frit including an etching component and includes the thermosetting resin R, which is cured at the low temperature (for example, about 230° C. to 260° C.), instead of the glass frit. Therefore, a heat damage applied to the first doped region 120 and the substrate 110 may be minimized. Hence, life time of a silicon bulk forming the substrate 110 increases, and an open-circuit voltage and a short circuit current density are improved. As a result, the efficiency of the solar cell may be improved.

After the electrode paste for low temperature curing according to the embodiment of the invention is cured at the low temperature of about 230° C. to 260° C., the substrate 110 is heated at the temperature of about 350° C. to 400° C. in an atmosphere of an inert gas to form silicide at the interface at which the second conductive particles P2 and the first doped region 120 contact each other.

Because the embodiment of the invention is described using the nickel particles as the second conductive particles P2 as an example, nickel silicide (NiSi) is formed at the interface contacting the first doped region 120.

The method for manufacturing the bifacial solar cell according to the embodiment of the invention may include forming the first doped region at the first surface of the substrate and forming the second doped region at the second surface of the substrate, forming the front dielectric layer on the first surface of the substrate and forming the back dielectric layer on the second surface of the substrate, forming the opening in each of the front dielectric layer and the back dielectric layer, applying the electrode paste for forming the first electrode part to the first doped region exposed through the opening of the front dielectric layer and applying the electrode paste for forming the second electrode part to the second doped region exposed through the opening of the back dielectric layer, performing the thermal process on the electrode paste for the first electrode part and the electrode paste for the second electrode part at the low temperature to cure the electrode pastes, and forming silicide.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
   a substrate of a first conductive type;
   a first doped region positioned at a first surface of the substrate and contains impurities of a second conductive type different from the first conductive type;
   a first dielectric layer formed on the first doped region and having a plurality of first openings;
   a first electrode part electrically connected to the first doped region through the plurality of first openings of the first dielectric layer and formed by performing a thermal process on an electrode paste including a thermosetting resin, which is cured at a temperature of 230° C. to 260° C. to act as a binder, and silver (Ag) and nickel (Ni) particles distributed in the thermosetting resin,
   wherein, after curing, both silver and nickel particles are present at an interface portion of the first electrode part; and
   a nickel silicide positioned at an interface of the first doped region in contact with the nickel particles present at the interface portion of the first electrode part,
   wherein the nickel silicide is formed by heating the substrate at a temperature of 350° C. to 400° C. in an atmosphere of an inert gas,
   wherein the nickel particles are 15 wt % to 25 wt % based on the total weight of the silver particles and the nickel particles, and
   wherein the thermosetting resin includes a monomer-based epoxy resin or an acrylic resin.

2. The solar cell of claim 1, wherein a size of a nickel particle is about 2 μm to 10 μm.

3. The solar cell of claim 1, wherein the first doped region is formed as an emitter region.

4. The solar cell of claim 1, wherein the first electrode part includes a plurality of first finger electrodes extending in a first direction and a plurality of first bus bar electrodes extending in a second direction crossing the first finger electrodes.

5. The solar cell of claim 1, further comprising:
   a second doped region positioned at a second surface opposite the first surface of the substrate and contains impurities of the first conductive type at a concentration higher than the substrate;
   a second dielectric layer formed on the second doped region and having a plurality of second openings; and
   a second electrode part electrically connected to the second doped region through the plurality of second openings of the second dielectric layer,
   wherein the second electrode part includes the Ag particles, the Ni particles, and the thermosetting resin, and
   a nickel silicide is positioned at the second doped region in contact with the nickel particles.

6. The solar cell of claim 5, wherein the second doped region is formed as a back surface field region.

7. The solar cell of claim 5, wherein the second electrode part includes a plurality of second finger electrodes extending in a first direction and a plurality of second bus bar electrodes extending in a second direction crossing the second finger electrodes.

* * * * *